United States Patent [19]

Tahara

[11] Patent Number: 5,521,431
[45] Date of Patent: May 28, 1996

[54] SEMICONDUCTOR DEVICE WITH LEAD FRAME OF MOLDED CONTAINER

[75] Inventor: Kazuhiro Tahara, Tokyo, Japan

[73] Assignee: NEC Corporation, Tokyo, Japan

[21] Appl. No.: 364,300

[22] Filed: Dec. 27, 1994

[30] Foreign Application Priority Data

Dec. 24, 1993 [JP] Japan ................... 5-348271

[51] Int. Cl.$^6$ .................................. H01L 23/48
[52] U.S. Cl. ................ 257/676; 257/666; 257/728
[58] Field of Search ........................... 257/666, 690, 257/786, 668, 787, 676, 672, 728

[56] References Cited

U.S. PATENT DOCUMENTS

| | | | |
|---|---|---|---|
| 4,780,795 | 10/1988 | Meinel | 257/703 |
| 4,989,068 | 1/1991 | Yasuhara et al. | 257/677 |
| 5,229,846 | 7/1993 | Kozuka | 257/666 |
| 5,276,352 | 1/1994 | Komenaka et al. | 257/787 |
| 5,382,829 | 1/1995 | Inoue | 257/668 |

FOREIGN PATENT DOCUMENTS

| | | | |
|---|---|---|---|
| 3-198402 | 8/1991 | Japan . | |
| 0251629 | 9/1993 | Japan | 257/728 |
| 0104372 | 4/1994 | Japan | 257/531 |

*Primary Examiner*—Robert P. Limanek
*Assistant Examiner*—Alexander Oscar Williams
*Attorney, Agent, or Firm*—Popham, Haik, Schnobrich & Kaufman, Ltd.

[57] ABSTRACT

The molded type semiconductor device has a semiconductor chip mounted and molded on a lead frame. The device includes a stub which has an open end at a portion of the lead frame and which is connected to a ground electrode of the semiconductor chip, and a mold resin which molds the stub together with the semiconductor chip. The stub has a length that is a ¼ wavelength of a signal wavelength used in the device. The stub is formed in a zigzag form or a spiral form. Due to such stub, the satisfactory grounding is ensured to accomplish a simple molded type structure and to improve circuit characteristics.

6 Claims, 5 Drawing Sheets

5,521,431

SEMICONDUCTOR DEVICE WITH LEAD FRAME OF MOLDED CONTAINER

BACKGROUND OF THE INVENTION (1) Field of the Invention

The present invention relates to a molded type semiconductor device, and more particularly to a molded type semiconductor device and a lead frame of a molded container which are used in the microwave band region.

(2) Description of the Related Art

As conventional microwave band semiconductor devices, there are those which are constructed by ceramic receptacles and those which are constructed by mold resin receptacles. In the former type, as shown in FIG. 1, a lead frame 22 is soldered to a ceramic receptacle 21, and the semiconductor chip 23 mounted in the ceramic receptacle 21 is electrically connected to the lead frame 22 by wires 24. Further, the semiconductor chip in the circuit is grounded by the connection established through a grounding lead 25 to a grounding portion 27 by, for example, solder 28, provided on a dielectric base plate 26 and by the connection established via a through-hole 29 to a grounding metal film 30. In this way, the grounding can be made with the shortest distance to the ground and the lowest impedance with almost no adverse influence to the circuit. However, the disadvantage therein is that the receptacle becomes structurally complex and costly.

In the latter of the types explained above, as shown in FIG. 2, a semiconductor chip 32 is mounted on a grounding lead 31a of a lead frame 31 with the electrical connection being made therebetween by a wire 33 and, after the other electrode is connected to the other lead 31b by a wire 34, the molding is made using a resin 35. For the grounding of the semiconductor chip 32, the connection is made through the wire 33 and the grounding lead 31a to a grounding portion 37 by solder 38 and through a through-hole 39 to a grounding metal film 40. The advantages in this arrangement are that the receptacle can be made simpler in its structure and less costly in its manufacture as compared with that of the former type. However, since it is difficult to make the length of the grounding lead 31a short, the grounding impedance inevitably becomes large. Thus, the mold type semiconductor device of the kind explained suffers from a deterioration of circuit characteristics in microwave band regions.

For the grounding in a circuit, use of a stub and a capacitor has been proposed in, for example, Japanese Patent Application Kokai Publication No. Hei 3-198402. This proposed configuration is shown in FIGS. 3A and 3B. Here, a circuit substrate 41 is multi-layered and consists of a plurality of insulating layers 42 and a plurality of conductive layers 43. As a part of the circuit, an open end stub 44 is formed and is connected to a part of one of the conductive layer 43. Thus, the grounding is established when the semiconductor chip is mounted on the circuit substrate 41 and the grounding electrode is connected to the open end stub 44.

However, although the foregoing configuration is effective in a hybrid integrated circuit device of the type in which the semiconductor chip is mounted directly in a circuit substrate, there is a difficulty in applying such a configuration to a discrete type semiconductor device as described above.

As shown in FIG. 4A, by connecting a power source electrode of a semiconductor chip 51 to a chip capacitor 53 by a wire 52 and connecting the chip capacitor 53 to a substrate 55 by a wire 54, it is possible to accomplish the grounding of a high frequency component at a node A of the capacitor 53 as shown in FIG. 4B. Here, $L_1$ and $L_2$ denote parasitic inductances of the wires 52 and 54, respectively. In this example, use of the chip capacitor 53 increases the number of component elements, hence increasing the cost involved. Also, in the case where this structure is to be sealed in a receptacle, there is no alternative but to use a ceramic receptacle in order to make the grounding of the capacitor 53, which complicates the structure and adds to the cost.

Thus, when a semiconductor device is fabricated using a conventional ceramic receptacle or a conventional external circuit, there will be a problem in that the structure becomes complex and requires a larger number of component elements, resulting in a higher manufacturing cost.

In the case where a conventional molded receptacle is used in the fabrication of a semiconductor device, there will be a problem in that the impedance of a lead at a microwave band region becomes large and makes the grounding difficult, resulting in deterioration of circuit characteristics.

SUMMARY OF THE INVENTION

An object of the present invention, therefore, is to overcome the problems existing in the prior art and to provide a semiconductor device which is simple in structure and is low cost in manufacturing, and in which the grounding can be made satisfactorily thereby improving circuit characteristics.

According to one aspect of the invention, there is provided a molded type semiconductor device having a semiconductor chip mounted and molded on a lead frame, the device comprising:

a stub which has an open end at a portion of the lead frame, the stub being connected to a ground electrode of the semiconductor chip and having a length that is a ¼ wavelength of a signal wavelength used in the device; and a mold resin which molds the stub together with the semiconductor chip.

In the semiconductor device according to the invention, the open end stub is formed using a part of the lead frame, is formed in a zigzag form or a spiral form, and is sealed together with the semiconductor chip in a mold resin. The device enjoys the advantages of a mold resin type semiconductor device, namely, the simplicity in structure and the low cost in fabrication. Furthermore, due to the open end stub, the grounding can be made satisfactorily, resulting in the improvement of circuit characteristics.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are described with reference to the drawings.

Figure 5:
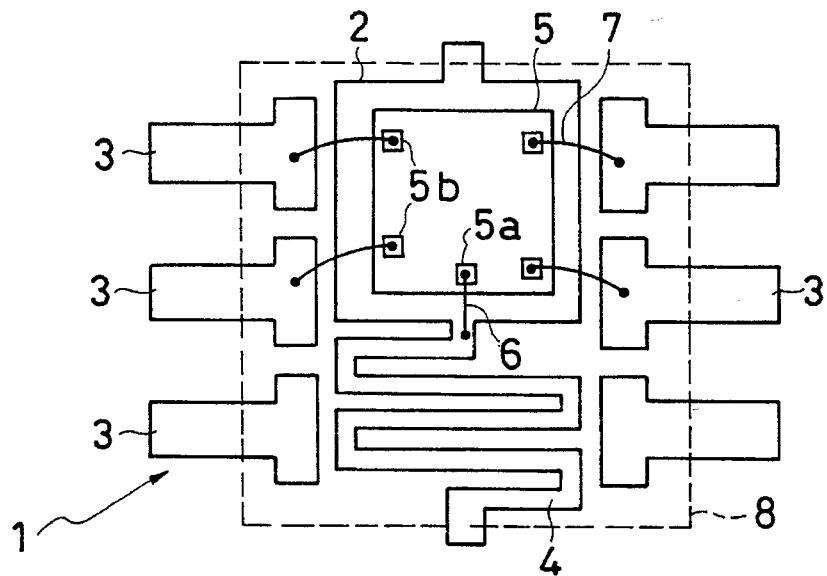
FIG. 5 is a plan view of an internal arrangement in a semiconductor device of a first embodiment according to the invention.

FIG. 5 shows, in a plan view, an internal arrangement within a semiconductor device of a first embodiment according to the invention. A lead frame 1 has a tub 2, on which a semiconductor chip is mounted, and a plurality of leads 3 for various signals. Next to the tub 2, an open and stub 4 which is formed in a zigzag form is provided integrally with the tub 2. The semiconductor chip 5 mounted on the tub 2 has grounding electrode 5a which is connected to one end of the open end stub 4 by a wire 6. Also, electrodes 5b for various signals of the semiconductor chip 5 and the leads 3 for various signals are respectively connected by wires 7. These elements are sealed as a unit in a mold resin 8 and constitute a molded resin receptacle. Here, the open end stub 4 is formed as a meander type open end stub having a length that is a ¼ wavelength of a signal wavelength used.

Figure 6A:
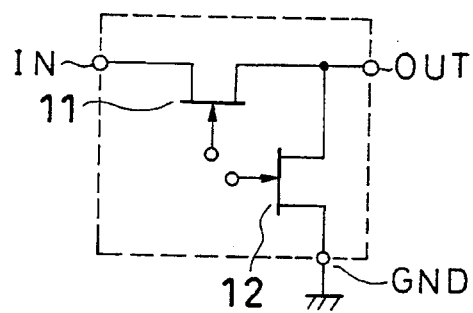
FIGS. 6A, 6B and 6C are diagrams of equivalent circuits for purposes of comparison, FIG. 6A representing a circuit considered to be ideal, FIG. 6B being a conventional circuit and FIG. 6C representing a circuit according to the present invention.
Figure 6B:
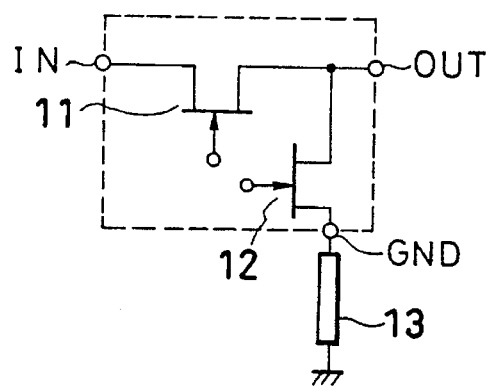
Figure 6C:
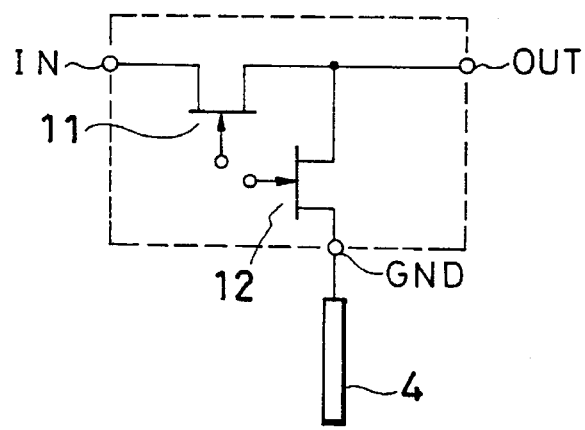

The semiconductor chip is formed as a switch circuit as shown in dashed lines in FIGS. 6A–6C. That is, the circuit contains two FETs 11 and 12, and has an input terminal IN, an output terminal OUT and a ground terminal GND which have connections to the FETs 11 and 12. In this circuit, when the FET 11 is ON and the FET 12 is OFF, the switch is in an ON state and, when the FET 11 is OFF and the FET 12 is ON, the switch is in an OFF state.

Figure 1:
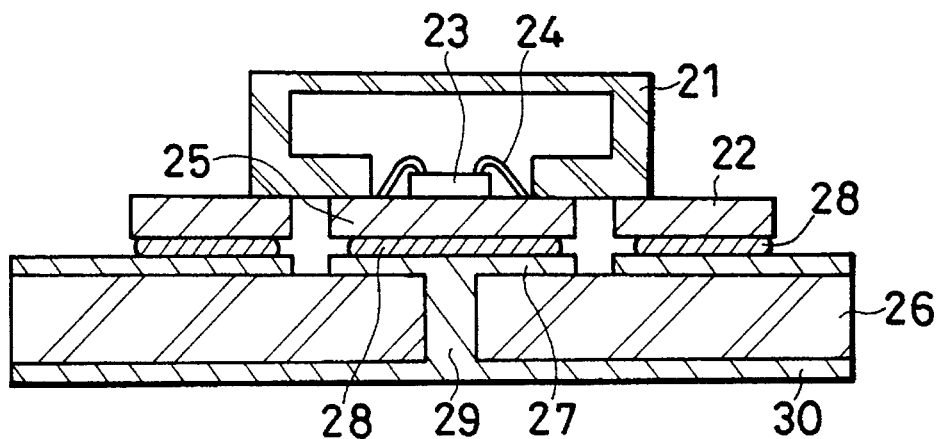
FIG. 1 is a diagrammatic sectional view of an example of a conventional ceramic receptacle type semiconductor device.
Figure 2:
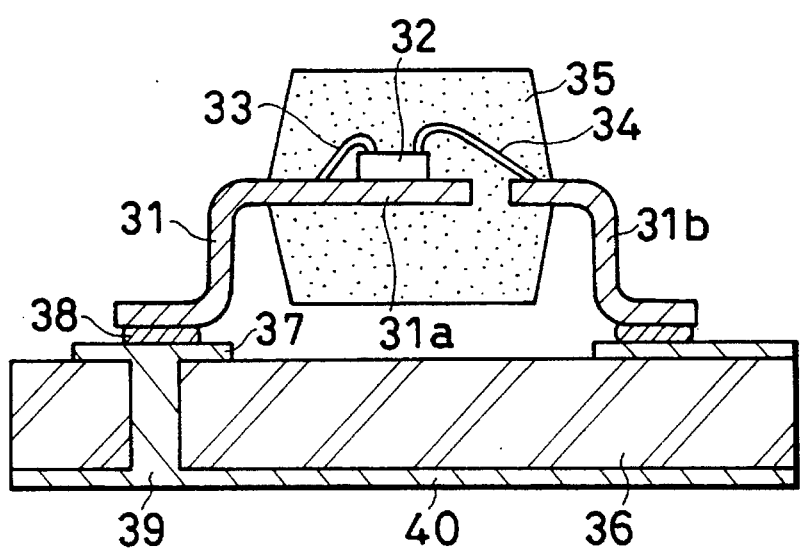
FIG. 2 is a diagrammatic sectional view of an example of a conventional mold resin type semiconductor device.
Figure 3A:
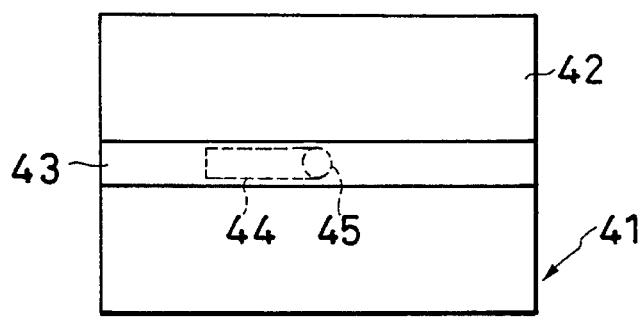
FIG. 3A is a plan view of an example of a conventional arrangement in which a stub is used for the grounding in a circuit.
Figure 3B:
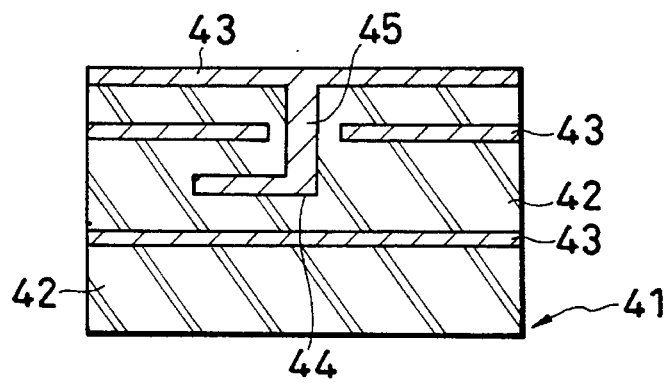
FIG. 3B is a diagrammatic sectional view of the same.
Figure 4A:
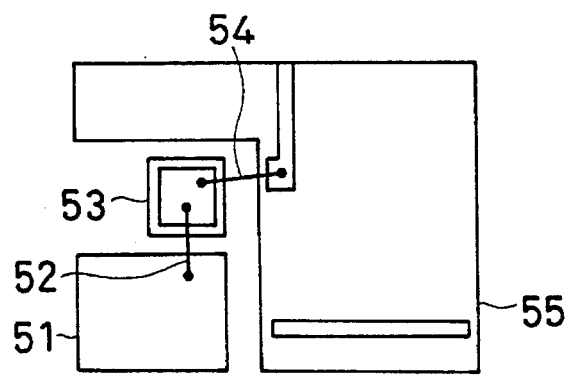
FIG. 4A is a plan view of an example of a conventional arrangement in which a chip capacitor is used for the grounding in a circuit.
Figure 4B:
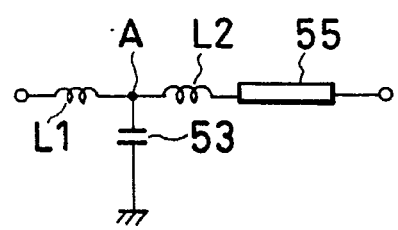
FIG. 4B is an equivalent circuit diagram of the same.
Figure 7:
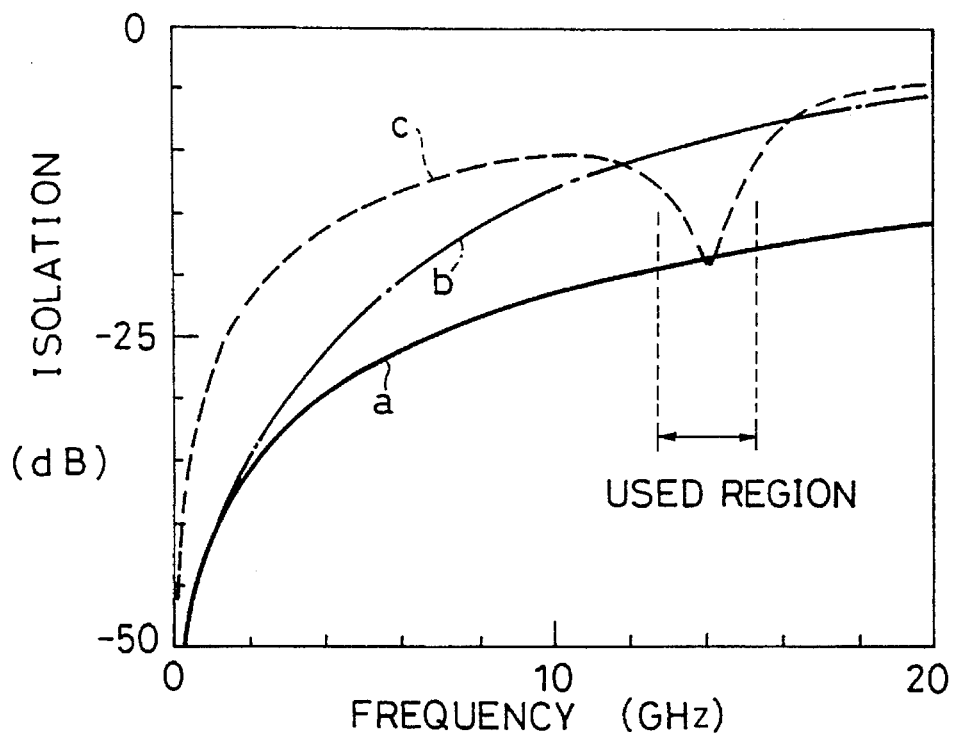
FIG. 7 is a graph showing isolation characteristics of the circuits shown in FIGS. 6A, 6B and 6C.

In the circuit, the complete grounding of the FET 12 as shown in FIG. 6A is ideal and, under such state, isolation characteristics are as given at "a" in FIG. 7 which shows that, even in the vicinity of 14 GHz, the isolation of 18 dB is accomplished. Assuming that the semiconductor chip is configured as a conventional mold resin type semiconductor device as shown in FIG. 2, the lead of the grounding terminal has an equivalent impedance as that of an end grounded type stub 13 as shown in an equivalent circuit of FIG. 6B. The isolation characteristic then is about 8 dB in the vicinity of 14 GHz as shown at "b" in FIG. 7, which is inferior by 10 dB as compared with that shown at "a" therein. Here, the stub of the equivalent circuit has been calculated with the width as being 0.3 mm, the length as being 1.0 mm and the distance with respect to ground as being 0.8 mm.

As shown in FIG. 5, in the mold resin type semiconductor device according to the invention, the ground terminal of the semiconductor chip 5 is connected to the open end stub 4 by the wire 6, and the equivalent circuit thereof is as shown in FIG. 6C. The grounding of the FET 12 is made using the open end stub 4 of a ¼ wavelength, and the grounding at the signal frequency band region used is well established. Thus, the isolation characteristic thereof is about 18 dB in the vicinity of 14 GHz as shown at "c" in FIG. 7, which is substantially the same as the ideal characteristic as shown at "a" in FIG. 7 and with which it is possible to prevent the characteristic deterioration.

With the above configuration, the construction of the mold resin type semiconductor device can be made simpler and be fabricated at low cost.

Figure 8:
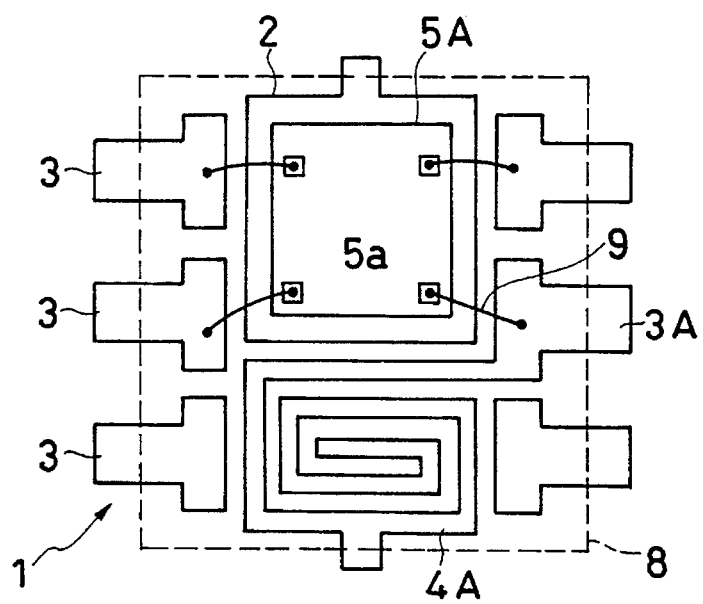
FIG. 8 is a plan view of an internal arrangement in a semiconductor device of a second embodiment according to the invention.
Figure 9:
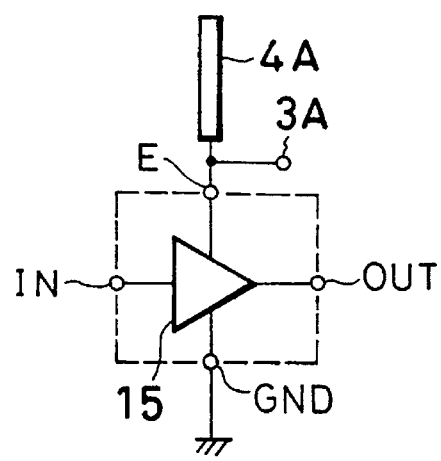
FIG. 9 is a diagram of an equivalent circuit of the semiconductor device shown in FIG. 8.

FIG. 8 is a plan view showing an internal arrangement of the device according to a second embodiment of the invention, in which the same numerals and symbols are used for the same or equivalent elements shown in FIG. 5. In this embodiment, the zigzag type open end stub 4 in the first embodiment is replaced by a spiral type open end stub 4A formed by a part of the lead frame, and one end of this stub 4A is connected to an external lead 3A. The circuit of the semiconductor chip 5A used in this embodiment is constituted by an amplifier 15 shown in dashed lines in FIG. 9, and the power source terminal E with the chip is connected to the external lead 3A by a wire 9, with which the open end stub 4A having a length that is a ¼ wavelength of the signal wavelength is connected in parallel, so that, in the equivalent circuit, the power source terminal E is in the state in which it is grounded with a signal frequency. As a basic normal configuration, in order to avoid external influences, the power source terminal of the high frequency circuit is often grounded on an equivalent circuit for the designing reason. According to the present invention, it is possible to readily realize the grounding at the high frequency region.

According to the invention, since the open end stub is formed using a portion of the lead frame, is connected with the ground terminal of the semiconductor chip and, moreover, is sealed in a mold resin together with the semiconductor chip, the resulting structure can be simple and be fabricated at low cost, and enables the satisfactory grounding due to the effects of the open end stub, thereby improving circuit characteristics. Especially, it is possible to readily realize the grounding of high frequency circuits of such as microwaves, and to suppress the deterioration of circuit characteristics to a minimum.

Also, by forming the open end stub in a zigzag shape or a spiral shape, the stub can be made compact, thereby contributing to miniaturization of a semiconductor device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A molded type semiconductor device having a semiconductor chip mounted and molded on a single lead frame, the device comprising:

a stub which has an open end at a portion of said lead frame, wherein said stub is connected to a ground electrode of said semiconductor chip and has a length that is ¼ of a signal wavelength used in the semiconductor device; and a mold resin which molds said stub together with said semiconductor chip.

2. The molded type semiconductor device according to claim 1, in which said stub is provided in a vicinity of a tub where the semiconductor chip is mounted, and is formed integrally with said tub.

3. The molded type semiconductor device according to claim 1, in which said stub is provided in a vicinity of a tub where the semiconductor chip is mounted, and is formed integrally with an external lead.

4. The molded type semiconductor device according to claim 1, in which said stub is formed in a zigzag form.

5. The molded type semiconductor device according to claim 1, in which said stub is formed in a spiral form.

6. The molded type semiconductor device according to claim 5, in which said semiconductor chip is provided with a circuit constituted by an amplifier, and said stub is connected to said amplifier.

* * * * *